United States Patent
Wuister et al.

(10) Patent No.: US 9,927,699 B2
(45) Date of Patent: Mar. 27, 2018

(54) IMPRINT LITHOGRAPHY

(75) Inventors: Sander Frederik Wuister, Eindhoven (NL); Vadim Yevgenyevich Banine, Deurne (NL)

(73) Assignee: ASML NETHERLANDS B.V., Veldhoven (NL)

( * ) Notice: Subject to any disclaimer, the term of this patent is extended or adjusted under 35 U.S.C. 154(b) by 164 days.

(21) Appl. No.: 13/070,101

(22) Filed: Mar. 23, 2011

(65) Prior Publication Data

US 2011/0233825 A1 Sep. 29, 2011

Related U.S. Application Data

(60) Provisional application No. 61/317,506, filed on Mar. 25, 2010.

(51) Int. Cl.
*G01B 11/25* (2006.01)
*G03F 7/00* (2006.01)
*B82Y 10/00* (2011.01)
*B82Y 40/00* (2011.01)

(52) U.S. Cl.
CPC .......... *G03F 7/0002* (2013.01); *B82Y 10/00* (2013.01); *B82Y 40/00* (2013.01)

(58) Field of Classification Search
CPC ........ G03F 7/0002; B82Y 10/00; B82Y 40/00
See application file for complete search history.

(56) References Cited

U.S. PATENT DOCUMENTS

| | | | |
|---|---|---|---|
| 4,731,155 A | 3/1988 | Napoli et al. | |
| 5,772,905 A | 6/1998 | Chou | |
| 6,334,960 B1 | 1/2002 | Willson et al. | |
| 2002/0094496 A1* | 7/2002 | Choi et al. | 430/322 |
| 2003/0081193 A1* | 5/2003 | White et al. | 355/72 |
| 2004/0124566 A1 | 7/2004 | Sreenivasan et al. | |
| 2005/0116370 A1 | 6/2005 | Ogino et al. | |
| 2005/0158419 A1* | 7/2005 | Watts et al. | 425/174.4 |
| 2005/0274693 A1 | 12/2005 | Heidari et al. | |
| 2006/0076717 A1* | 4/2006 | Sreenivasan et al. | 264/494 |
| 2006/0082752 A1* | 4/2006 | Bleeker et al. | 355/69 |
| 2006/0192928 A1* | 8/2006 | Kasumi et al. | 355/30 |

(Continued)

FOREIGN PATENT DOCUMENTS

| | | |
|---|---|---|
| WO | 2002/067055 | 8/2006 |
| WO | 2009/153926 | 12/2009 |

OTHER PUBLICATIONS

J. Haisma, "Mold-Assisted Nanolithography: A Process for Reliable Pattern, Replication," J. Vac. Sci. Technol. B14(6), Nov./Dec. 1996, pp. 4124-4128.

*Primary Examiner* — Edmund H Lee
(74) *Attorney, Agent, or Firm* — Pillsbury Winthrop Shaw Pittman LLP

(57) ABSTRACT

An imprint lithography apparatus is disclosed which includes a pattern fixing system configured to use actinic radiation to fix a pattern provided in a layer of imprintable medium by an imprint lithography template, and an inspection system configured to use inspection radiation to inspect an element constituting or, in use, being located within, the imprint lithography apparatus. The imprint lithography apparatus is configured such that the pattern fixing system and the inspection system are provided, in use, with, respectively, actinic radiation and inspection radiation from a single source of radiation.

20 Claims, 6 Drawing Sheets

(56) References Cited

U.S. PATENT DOCUMENTS

| | | |
|---|---|---|
| 2006/0196945 A1* | 9/2006 | Mendels .................. 235/470 |
| 2006/0254446 A1 | 11/2006 | Lof |
| 2006/0268256 A1 | 11/2006 | Kolesnychenko et al. |
| 2007/0200276 A1* | 8/2007 | Mackey et al. ............ 264/293 |
| 2007/0242272 A1 | 10/2007 | Suehira et al. |
| 2007/0246850 A1 | 10/2007 | Schumaker |
| 2007/0266875 A1* | 11/2007 | Berge ..................... 101/481 |
| 2008/0013097 A1* | 1/2008 | E. del Puerto ............ 356/500 |
| 2008/0083818 A1* | 4/2008 | Best et al. ............... 228/103 |
| 2008/0094592 A1* | 4/2008 | Shibazaki ................. 355/53 |
| 2008/0151205 A1* | 6/2008 | Ivanov et al. ............. 355/53 |
| 2008/0180668 A1* | 7/2008 | Van Haren et al. ........ 356/364 |
| 2009/0101037 A1 | 4/2009 | Suehira et al. |
| 2009/0214761 A1 | 8/2009 | Sreenivasan et al. |

* cited by examiner

IMPRINT LITHOGRAPHY

This application claims priority and benefit under 35 U.S.C. § 119(e) to U.S. Provisional Patent Application No. 61/317,506, entitled "Imprint Lithography", filed on Mar. 25, 2010. The content of that application is incorporated herein in its entirety by reference.

FIELD

The present invention relates to imprint lithography, and in particular to an imprint lithography apparatus and/or an imprint lithography method.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features (e.g. micron size or nanometer sized features, e.g., less than or equal to 10 microns, less than or equal to 1 micron, less than or equal to 50 nm, less than or equal 25 nm or less than or equal to 10 nm sized features) that has gained increasing interest is so-called imprint lithography, which generally involves the use of a "stamp" (often referred to as an imprint lithography template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint lithography template.

Imprint lithography involves the patterning of an imprintable medium on a surface of a substrate to be patterned. The patterning may involve bringing together a patterned surface of an imprint lithography template and a layer of imprintable medium (e.g., moving the imprint lithography template toward the imprintable medium, or moving the imprintable medium toward the imprint lithography template, or both) such that the imprintable medium flows into recesses in the patterned surface and is pushed aside by protrusions on the patterned surface, to adopt the topography of that patterned surface. The recesses define pattern features of the patterned surface of the imprint template. The patterned features may have features having dimensions of the order of micrometers or nanometers. Typically, the imprintable medium is flowable when the patterned surface and the imprintable medium are brought together. Following patterning of the imprintable medium, the imprintable medium is suitably brought into a non-flowable or frozen state (i.e. a fixed state), for example by illuminating the imprintable medium with actinic radiation. The patterned surface of the imprint lithography template and the patterned imprintable medium are then separated. The substrate and patterned imprintable medium are then typically processed further in order to pattern or further pattern the substrate (e.g. by etching or the like). The imprintable medium may be provided in the form of droplets on the surface of a substrate to be patterned, but may alternatively be provided using spin coating or the like.

In order to fix a pattern provided in a layer of imprintable medium by an imprint lithography template, a number of options are available. One option involves heating of the imprintable medium to fix the pattern provided in that medium by the imprint lithography template. Another option involves the use of irradiation of the imprintable medium with actinic radiation. In order to provide such actinic radiation, a source of actinic radiation is in connection with the imprint lithography apparatus, or forms part of that imprint lithography apparatus. A UV laser could be used to provide the actinic radiation.

SUMMARY

A UV laser is typically expensive, and a more cost effective solution involves the use of a mercury lamp or a mercury/xenon lamp. However, although cheaper than a UV laser, the mercury and/or mercury/xenon lamp has a disadvantage associated with its use. Such a lamp comprises electrodes for use in the generation of the UV radiation. The structural integrity of these electrodes degrades over time, limiting the lifetime of the lamp. Furthermore, a stability (optical or otherwise) of the lamp decreases continually over time. It would be advantageous to provide a source of actinic radiation that has a long lifetime (in comparison with the above-mentioned lamp), and has a stability (e.g. including an intensity) that does not decrease over time, or at least decrease substantially over time.

In addition to the actinic radiation used in fixing a pattern provided in a layer of imprintable medium by an imprint lithography template, additional radiation may be required for use in the imprint lithography apparatus. For instance, such additional radiation may take the form of inspection radiation, used in the optical inspection of one or more elements constituting, or, in use, being located within, the imprint lithography apparatus. Such elements may include, for example, the imprint lithography template itself, the layer of imprintable medium before being subjected to an imprint with the imprint lithography template, or a patterned layer of imprintable medium after imprinting. In order to provide such inspection radiation, a separate radiation source has been proposed as being used. However, the use of multiple radiation sources forming part of an imprint lithography apparatus, or being in connection with that imprint lithography apparatus, increases the cost and size of the imprint lithography apparatus, or associated apparatus, as a whole. Furthermore, it is conceivable that there may be overlap, in terms of wavelengths, between the actinic radiation and the inspection radiation. If this overlap is not carefully taken into account, it is possible that inspection of one or more elements of, or in use located within, the imprint lithography apparatus may result in an unintentional fixing or the like of one or more regions of imprintable medium.

It is an aim of an embodiment of the present invention to provide an imprint lithography apparatus and/or an imprint lithography method that obviates or mitigates at least one problem of the art, whether identified herein or elsewhere, or which provides an alternative to an existing imprint lithography apparatus and/or an existing imprint lithography method.

According to an aspect of the present invention, there is provided an imprint lithography apparatus comprising: a pattern fixing system, configured to use actinic radiation to fix a pattern provided in a layer of imprintable medium by an imprint lithography template; and an inspection system, configured to use inspection radiation to inspect an element constituting or, in use, being located within, the imprint lithography apparatus, the imprint lithography apparatus configured such that the pattern fixing system and the inspection system are provided, in use, with, respectively, actinic radiation and inspection radiation from a single source of radiation.

The imprint lithography apparatus may further comprise a source of radiation to provide both the actinic radiation and the inspection radiation.

There may be at least a partial overlap in terms of wavelength between the actinic radiation and the inspection radiation.

The imprint lithography apparatus may further comprise a switch changeable between a first configuration and a second configuration, the switch in the first configuration allowing actinic radiation to pass to the pattern fixing system, and/or the switch in the second configuration allowing inspection radiation to pass to the inspection system.

The switch in the first configuration may prevent inspection radiation from passing to the inspection system, and/or the switch in the second configuration may prevent actinic radiation from passing to the pattern fixing system.

The switch may comprise a moveable mirror.

There may be no overlap, or substantially no overlap, in terms of wavelength between the actinic radiation and the inspection radiation.

The imprint lithography apparatus may further comprise a selector, configured to ensure that, from the single source of radiation, actinic radiation is allowed to pass to the pattern fixing system, and/or inspection radiation is allowed to pass to the inspection system.

The selector may be or may comprise one or more selected from the following: a grating, a beam splitter, a dichroic mirror, or a filter.

The element constituting or, in use, being located within, the imprint lithography apparatus may be one or more selected from the following: an imprint lithography template, a pattern provided in a layer of imprintable medium by an imprint lithography template, or a layer of imprintable medium provided on a substrate.

The imprint lithography apparatus may comprise an imprint lithography template holder to: hold and/or move an imprint lithography template in a first region of the imprint lithography apparatus to imprint into a layer of imprintable medium; and/or move the imprint lithography template to, or hold the imprint lithography template in, a second region of the imprint lithography apparatus for inspection by the inspection system.

The imprint lithography apparatus may comprise: a first imprint lithography template holder to hold and/or move an imprint lithography template in a first region of the imprint lithography apparatus to imprint into a layer of imprintable medium; and a second imprint lithography template holder to move the imprint lithography template to, and/or hold the imprint lithography template in, a second region of the imprint lithography apparatus for inspection by the inspection system.

According to an aspect of the present invention, there is provided an imprint lithography method comprising: using actinic radiation to fix a pattern provided in a layer of imprintable medium by an imprint lithography template; and using inspection radiation to inspect an element constituting or, in use, being located within, an imprint lithography apparatus, the actinic radiation and the inspection radiation both being provided by a single source of radiation.

Inspection may be undertaken before, after or during the fixing of the pattern.

The method aspect may have, wherever appropriate, one or more features of the apparatus aspect.

According to an aspect of the present invention, there is provided an imprint lithography apparatus comprising an imprint lithography template holder to hold an imprint lithography template to imprint into a layer of imprintable medium, the imprint lithography apparatus further comprising, or being in connection with, an electrode-free radiation source to generate actinic radiation for use in fixing a pattern provided in a layer of imprintable medium by the imprint lithography template, the radiation source being a laser produced plasma radiation source.

BRIEF DESCRIPTION OF THE DRAWINGS

Specific embodiments of the invention will be described with reference to the accompanying Figures, in which.

DETAILED DESCRIPTION

Figure 1A:
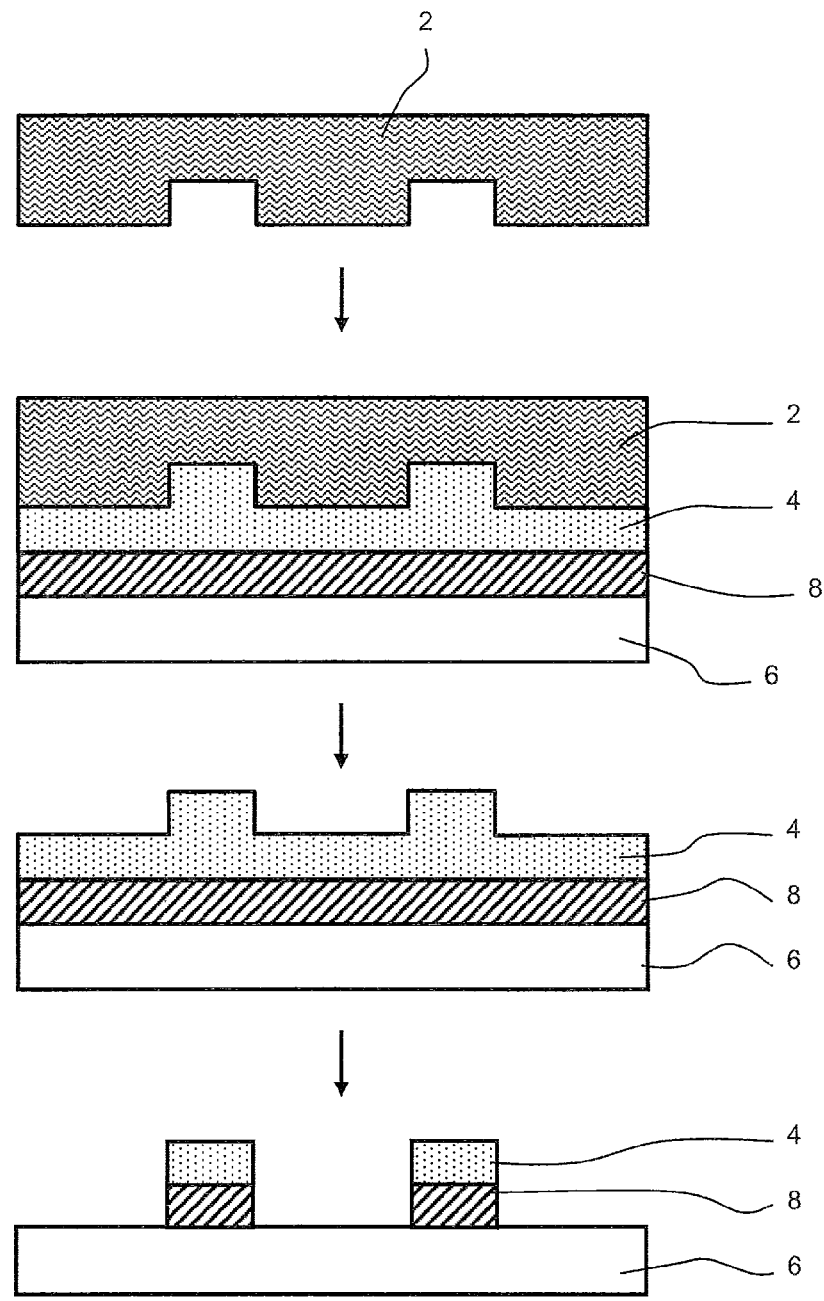
FIGS. 1A and 1B schematically depict examples of, respectively, hot imprint, and UV imprint lithography.
Figure 1B:
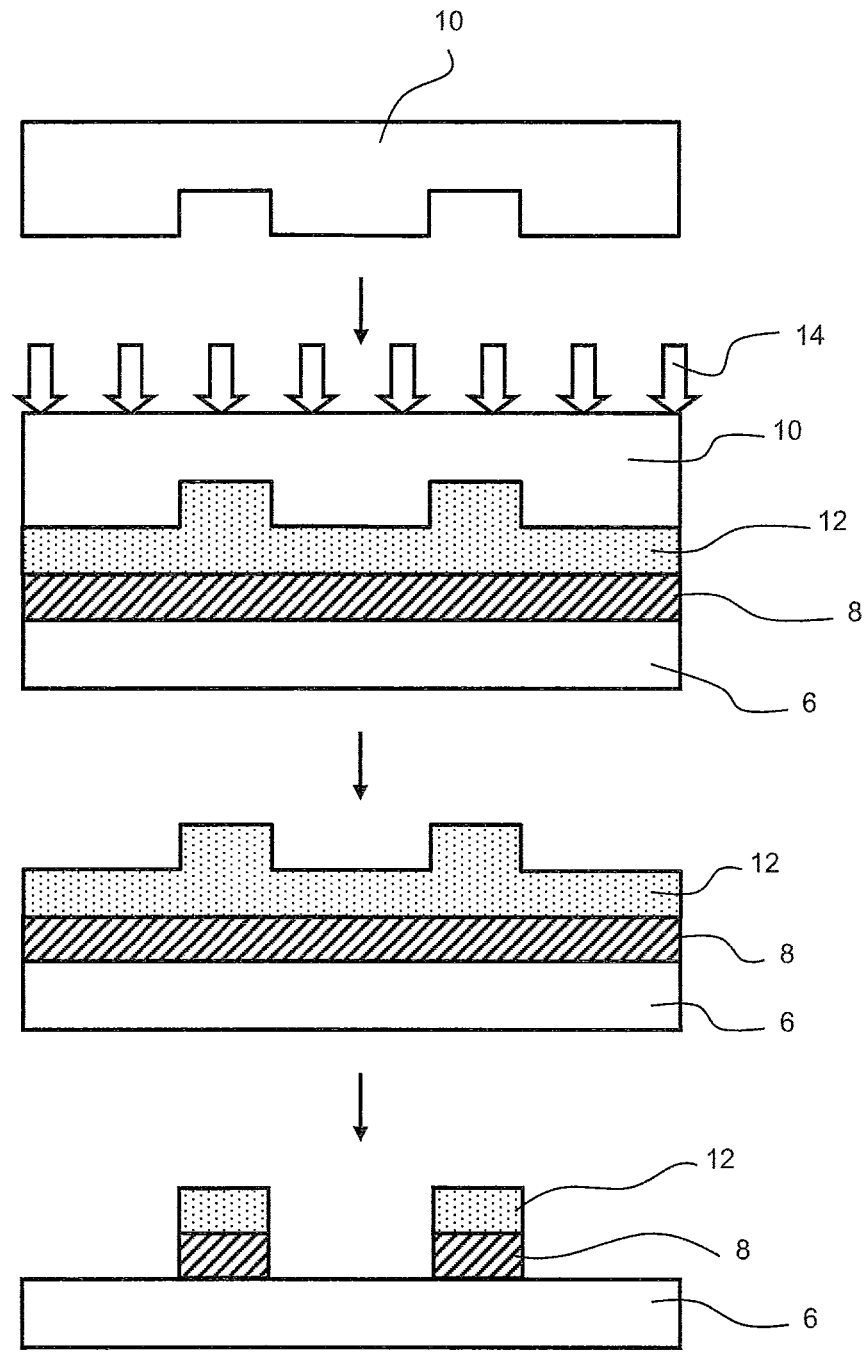

Examples of two known approaches to imprint lithography are schematically depicted in FIGS. 1A to 1B.

FIG. 1A shows an example of so-called hot imprint lithography (or hot embossing). In a typical hot imprint process, a template 2 is imprinted into a thermosetting or a thermoplastic imprintable medium 4, which has been cast on the surface of a substrate 6. The imprintable medium 4 may be, for example, resin. The resin, for instance, may be spin coated and baked onto the substrate surface or, as in the example illustrated, onto a planarization and transfer layer 8 of the substrate 6. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template 2 may then be removed and the patterned resin cooled. In hot imprint lithography employing a layer of thermoplastic polymer resin, the thermoplastic resin is heated so that it is in a freely flowable state immediately prior to imprinting with the template 2. It may be necessary to heat a thermoplastic resin to a temperature considerably above the glass transition temperature of the resin. The template is pressed into the flowable resin and then cooled to below its glass transition temperature with the template 2 in place to harden the pattern. Thereafter, the template 2 is removed. The pattern will consist of the features in relief from a residual layer of the imprintable medium which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. No. 4,731,155 and U.S. Pat. No. 5,772,905.

FIG. 1B shows an example of UV imprint lithography, which involves the use of a transparent or translucent imprint lithography template 10 which is transmissive to UV radiation and a UV-curable liquid as imprintable medium 12 (the term "UV" is used here for convenience but should be interpreted as including any suitable actinic radiation for curing the imprintable medium). A UV curable liquid is often less viscous than a thermosetting or thermoplastic resin used in hot imprint lithography and consequently may move much faster to fill template pattern features. A quartz template 10 is applied to a UV-curable resin 12 in a similar manner to the process of FIG. 1A. However, instead of using heat or temperature cycling as in hot imprint lithography, the pattern is frozen (i.e. fixed) by curing the imprintable medium 12 with UV radiation 14 that is applied through the quartz imprint lithography template 10 onto the imprintable medium 12. After removal of the imprint lithography template 10, the imprintable medium 12 is etched (and/or undergoes other further processing) to, for example provide pattern features in or on the substrate 6. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are possible. See, e.g., U.S. Patent Application Publication No. 2005-0274693, which mentions a combination of heating and UV curing an imprintable medium.

As discussed above, in addition to the use of actinic radiation for fixing a pattern provided in a layer of imprintable medium by an imprint lithography template, it may also be desirable or required to provide inspection radiation for inspecting an element of, or in use located within, an imprint lithography apparatus. The provision of a dedicated source of actinic radiation and a separate dedicated source of inspection radiation may add to the cost or size of the imprint lithography apparatus, or if the sources are in connection with imprint lithography apparatus, space required to accommodate the sources and imprint lithography apparatus.

An imprint lithography apparatus according to an embodiment of the present invention comprises a pattern fixing system, configured to use actinic radiation to fix a pattern provided in a layer of imprintable medium by an imprint lithography apparatus. The imprint lithography apparatus further comprises an inspection system, configured to use inspection radiation to inspect an element constituting or, in use, being located within the imprint lithography apparatus. The imprint lithography apparatus may be distinguished from existing or proposed imprint lithography apparatus by being configured such that the pattern fixing system and the inspection system are provided or provideable with, respectively, and in use, actinic radiation and inspection radiation from a single source of radiation.

The imprint lithography apparatus may comprise that single source of radiation, or be in connection with that single source of radiation. The configuration of the imprint lithography apparatus which achieves this result may involve the use of one or more switches (e.g. an optical switch such as a moveable mirror or the like) or one or more filters or beam splitters or the like, which in combination or isolation may ensure that inspection radiation is passed to and/or used by the inspection system and that actinic radiation is passed to and/or used by the pattern fixing system, all radiation being derived from the single source of radiation.

According to a further aspect of the invention, there is provided a corresponding imprint lithography method. The imprint lithography method comprises using actinic radiation to fix a pattern provided in a layer of imprintable medium by an imprint lithography template. The method further comprises using inspection radiation to inspect an element constituting, or in use, being located within, an imprint lithography apparatus. The method may be distinguished from existing or proposed methods by the actinic radiation and the inspection radiation being provided by a single source of radiation (which may be located within, or be in connection with, an imprint lithography apparatus used to carry out the method). The inspection may be undertaken before, after, or during, the fixing of the pattern.

One or more imprint lithography apparatus will be described herein. Some of the elements described as forming part of lithographic apparatus, or being located within the lithographic apparatus, may not form a permanent part of the lithographic apparatus, or be permanently located within the lithographic apparatus. For example, a substrate provided with imprintable medium may only be temporarily located within the imprint lithography apparatus during an imprint method or process. Similarly, one or more imprint lithography templates may be movable into and out of the imprint lithography apparatus, for example, imprint lithography templates with different pattern features, or a cleaned imprint lithography template may be interchanged with a contaminated imprint lithography template. As already described above, any radiation source described in relation to the imprint lithography apparatus may in some embodiments form a part of that imprint lithography apparatus, or in other embodiments may only be in connection with that imprint lithography apparatus. By being in connection with an imprint lithography apparatus, radiation generated by the radiation source may be passed to the imprint lithography apparatus. Being in connection with the imprint lithography apparatus does not necessarily imply that the radiation source is physically attached to the imprint lithography apparatus, and the radiation source may not even be in the same room (e.g. clean room) as the imprint lithography apparatus.

Embodiments of this aspect of the invention will now be described, by way of example only, with reference to FIGS. 2-6. In these Figures, like features appearing in different Figures have been given the same reference numerals, for consistency and clarity. It should be noted that the Figures have not been drawn to any particular scale.

Figure 2:
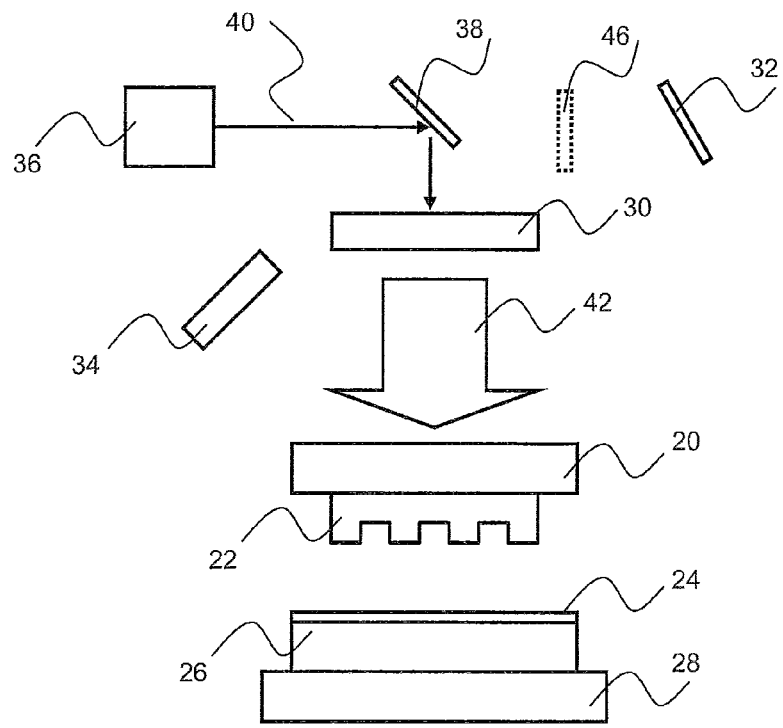
FIG. 2 schematically predicts an imprint lithography apparatus in accordance with an embodiment of the present invention.

FIG. 2 schematically depicts an imprint lithography apparatus in accordance with an embodiment of the present invention. The imprint lithography apparatus comprises an imprint lithography template holder 20. The imprint lithography template holder 20 holds, in use, an imprint lithography template 22. Movement of the imprint lithography template holder 20 may be undertaken to facilitate appropriate movement of the imprint lithographic template 22. In use, the imprint lithography template 22 may be brought into contact with and imprinted into a layer of imprintable medium 24 provided on a substrate 26. The substrate 26 is held by a substrate holder 28. Movement of the substrate 26 may be facilitated by appropriate movement of the substrate holder 28.

The imprint lithography apparatus further comprises a pattern fixing system, configured to use actinic radiation to fix a pattern provided in the layer of imprintable medium 24 by the imprint lithography template 22. In this embodiment, the pattern fixing system comprises optics 30 which may be used to appropriately control the configuration (e.g. the spatial or angular intensity distribution) of a beam of actinic radiation used to fix the pattern provided in the layer of imprintable medium 24.

The imprint lithography apparatus further comprises an inspection system, configured to use inspection radiation to inspect an element constituting, or in use, being located within the imprint lithography apparatus (e.g. the imprint lithography template 22, a pattern provided in the layer of imprintable medium 24 by the imprint lithography template 22, or a layer of imprintable medium 24 provided on the substrate 26, prior to imprinting). In this embodiment, the inspection system comprises a mirror 32 used to direct inspection radiation toward the element that is to be inspected. The inspection system further comprises a detector 34 (e.g. a CCD array, one or more photodiodes, a camera, or the like) for use in inspecting, and/or taking measurements of a property of the inspected element, or radiation re-directed by that inspected element.

A source of radiation 36 is also provided (which as discussed above may or may not be part of the lithographic apparatus). The source of radiation 36 is configured to provide both the actinic radiation and the inspection radiation referred to previously.

In this embodiment, there is at least a partial overlap in terms of wavelength between the actinic radiation and the inspection radiation. For example, the actinic radiation may comprise radiation having a wavelength or wavelengths in the range of 250 nm to 400 nm. Inspection may be undertaken with inspection radiation having a wavelength or wavelengths in the range of 350 nm to 450 nm. Due to the overlap in wavelength, this means that during fixing of the pattern provided in the layer of imprintable medium 24, no inspection can be undertaken. However, fixing of the pattern is estimated to account for only 10-20% of the time budget set aside for the total process involved in a single imprint. Thus, after the imprint lithography template 22 has been released from the layer of imprintable medium 24, there will be more than enough time to inspect, for example, the imprint lithography template 22 or any other element of imprint lithography apparatus without any or significant reduction of the throughput of the imprint lithography apparatus as a whole.

Since there is wavelength overlap between the actinic radiation and the inspection radiation, the imprint lithography apparatus is configured to be able to selectively direct radiation toward and/or through the pattern fixing system and the inspection system. In one example, the imprint lithography apparatus further comprises a switch 38 changeable (e.g. movable) between a first configuration and a second configuration to achieve this.

FIG. 2 shows the switch 38 in the first configuration. The switch 38 in the first configuration allows actinic radiation 40 to pass to the pattern fixing system, for example, optics 30. Optics 30 then manipulates the actinic radiation to form, for example, a broader beam of actinic radiation 42 which may be directed towards the imprint lithography template 22 when it has been imprinted into the layer of imprintable medium 24.

Figure 3:
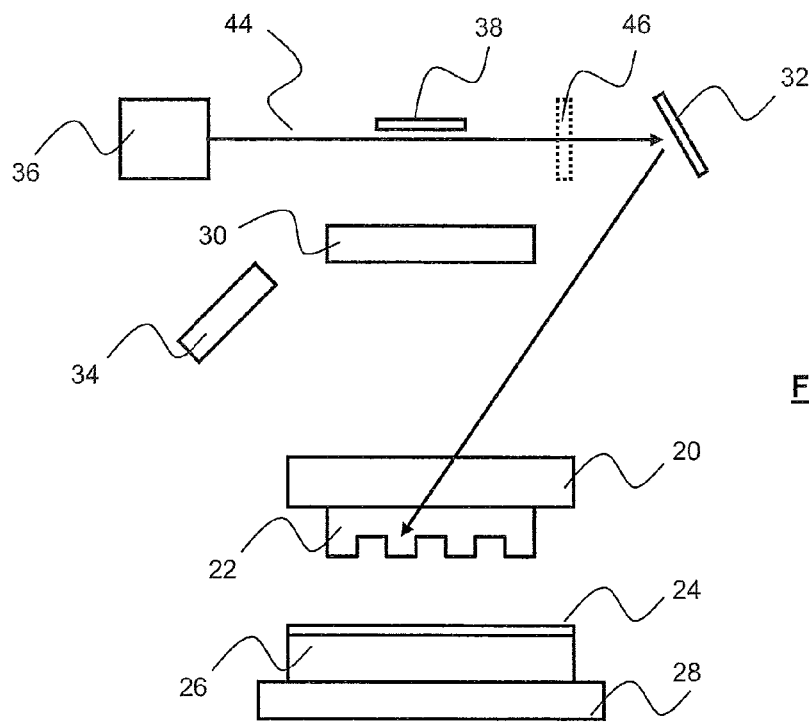
FIG. 3 schematically depicts the same imprint lithography apparatus of FIG. 2, but in a different configuration.

FIG. 3 shows the switch 38 in the second configuration. In the second configuration, the switch 38 allows inspection radiation 44 to pass to the inspection system, which comprises mirror 32 to direct radiation towards, for example, the imprint lithography template 22.

Additionally, when the switch 38 is in the first configuration, inspection radiation may be prevented from passing to the inspection system, and the switch in the second configuration may prevent actinic radiation from passing to the pattern fixing system, both situations being depicted in FIGS. 2 and 3 respectively.

The switch may take any appropriate form. For example, the switch may take the form of one or more arrangements to block the path of a radiation beam, or to re-direct the path of a radiation beam, for example a mirror, or a movable mirror.

Figure 4:
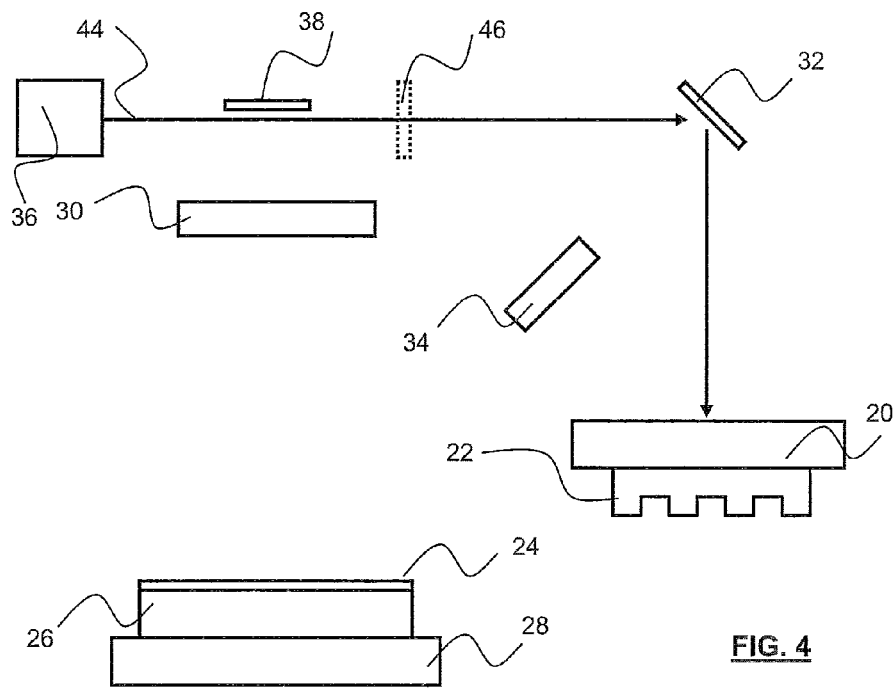
FIG. 4 schematically depicts an imprint lithography apparatus according to a related, but different, embodiment to that shown in FIG. 2 and FIG. 3.

In FIG. 3 inspection radiation 44 is shown as being directed towards the imprint lithography template 22 for inspection of the imprint lithography template 22 when the imprint lithography template 22 is in a first region of the imprint lithography apparatus, suitable for imprinting into a layer of the imprintable medium 24. FIG. 4 shows that, in another example, inspection of the imprint lithography template 22 may be undertaken when the imprint lithography template 22 has been moved to a second region of the imprint lithography apparatus, for example a second region that is dedicated to the inspection process. The imprint lithography template 22 may be moved to the second region by appropriate movement of the imprint lithography template holder 20. In another example, a second imprint lithography template holder (not shown) may hold and move the imprint lithography template 22 to the second region, whereas a first imprint lithography template holder may hold and move another imprint lithography template in the first region, to imprint into a layer of imprintable medium. By inspecting an imprint lithography template in a different region of the imprint lithography apparatus to the region in which imprinting takes place, a first imprint lithography template may be inspected while a second imprint lithography template is being imprinted into a layer of imprintable medium. This may increase throughput. The region or regions may be or comprise, for example, a chuck. An imprint lithography template holder might form or be such a chuck.

The imprint lithography apparatus described above may include one or more additional elements, for example one or more filters 46 or selectors (described below) or the like to ensure that appropriately filtered radiation is used by one or both of the inspection system and/or pattern fixing system.

Figure 5:
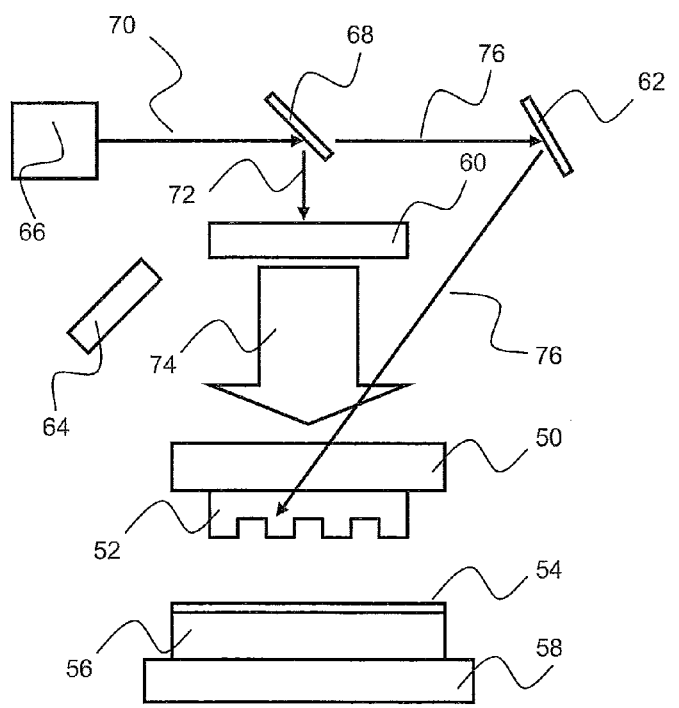
FIG. 5 schematically depicts an imprint lithography apparatus according to an embodiment of the present invention.

FIG. 5 schematically depicts an imprint lithography apparatus in accordance with a further embodiment of the present invention. The imprint lithography apparatus comprises an imprint lithography template holder 50. The imprint lithography template holder 50 holds, in use, an imprint lithography template 52. Movement of the imprint lithography template holder 50 may be undertaken to facilitate appropriate movement of the imprint lithographic template 52. In use, the imprint lithography template 52 may be brought into contact with and imprinted into a layer of imprintable medium 54 provided on a substrate 56. The substrate 56 is held by a substrate holder 58. Movement of the substrate 56 may be facilitated by appropriate movement of the substrate holder 58.

The imprint lithography apparatus further comprises a pattern fixing system, configured to use actinic radiation to fix a pattern provided in the layer of imprintable medium 54 by the imprint lithography template 52. In this embodiment, the pattern fixing system comprises optics 60 which may be used to appropriately control the configuration (e.g. the spatial or angular intense distribution) of a beam of actinic radiation used to fix the pattern provided in the layer of imprintable medium 54.

The imprint lithography apparatus further comprises an inspection system, configured to use inspection radiation to inspect an element constituting, or in use, being located within the imprint lithography apparatus (e.g. the imprint lithography template 52, a pattern provided in the layer of imprintable medium 54 by the imprint lithography template 52, or a layer of imprintable medium 54 provided on the substrate 56, prior to imprinting). In this embodiment, the inspection system comprises a mirror 62 used to direct inspection radiation toward the element that is to be inspected. The inspection system further comprises a detector 64 (e.g. a CCD array, one or more photodiodes, a camera, or the like) for use in inspecting, and/or taking measurements of a property of the inspected element, or radiation re-directed by that inspected element.

A source of radiation 66 is also provided (which as discussed above may or may not be part of the lithographic apparatus). The source of radiation 66 is configured to provide both the actinic radiation and the inspection radiation referred to previously.

In this embodiment, there is no overlap in terms of wavelength between the actinic radiation and the inspection radiation. For example, the actinic radiation may comprise radiation having a wavelength or wavelengths in the range of 250 nm up to and including 400 nm. Inspection may be undertaken with inspection radiation having a wavelength or wavelengths in the range of less than 250 nm or greater than 400 nm. A wavelength or wavelengths in the range of less than 250 nm may not be desirable, since such a wavelength may fix (i.e. cure) imprintable medium. Due to there being no overlap in the wavelength, this means that during fixing of the pattern provided in the layer of imprintable medium 54, inspection can also be undertaken (i.e. simultaneously).

Since there is no overlap in terms of wavelength between the actinic radiation and the inspection radiation, the imprint lithography apparatus does not need to be configured to be able to selectively direct radiation toward and/or through the pattern fixing system and the inspection system, as shown in FIGS. 3-5. Instead, a form of selector 68 is provided (e.g. a grating, a beam splitter, a dichroic mirror, or a filter). The selector 68 is configured to ensure that, from radiation 70 from the single source of radiation 66, only actinic radiation 72 is allowed to pass to the pattern fixing system, for example, optics 60. Optics 60 then manipulates the actinic radiation 72 to form, for example, a broader beam of actinic radiation 74 which may be directed towards the imprint lithography template 52 when it has been imprinted into the layer of imprintable medium 54. The selector 68 is also configured to ensure that, from radiation 70 from the single source of radiation 66, only inspection radiation 76 is allowed to pass to the inspection system, which comprises mirror 62 to direct radiation towards, for example, the imprint lithography template 52.

The selector 68 may take any appropriate form. For example, the selector 68 may take the form of one or more arrangements to filter or split a single beam into beams having different wavelength or different ranges of wavelengths, for example a grating, a beam splitter, a dichroic mirror, or a filter.

Figure 6:
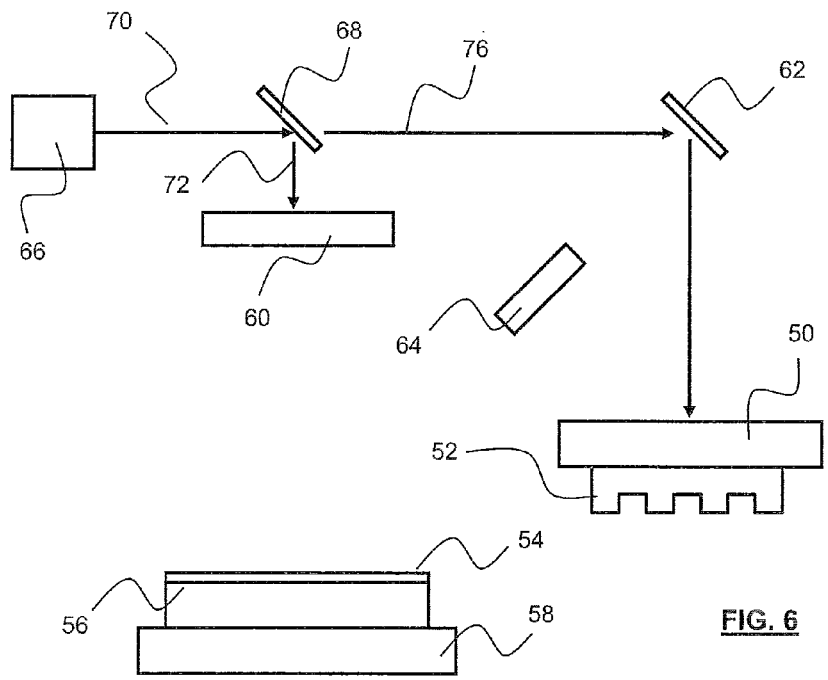
FIG. 6 schematically depicts an imprint lithography apparatus according to a related, but different, embodiment to that shown in FIG. 5.

In FIG. 5, inspection radiation 76 is shown as being directed towards the imprint lithography template 52 for inspection of the imprint lithography template 52 when the imprint lithography template 52 is in a first region of the imprint lithography apparatus, suitable for imprinting into a layer of the imprintable medium 54. FIG. 6 shows that, in another example, inspection of the imprint lithography template 52 may be undertaken when the imprint lithography template 52 has been moved to a second region of the imprint lithography apparatus, for example a second region that is dedicated to the inspection process. The imprint lithography template 52 may be moved to the second region by appropriate movement of the imprint lithography template holder 50. In another example, a second imprint lithography template holder (not shown) may hold and move the imprint lithography template 52 to the second region, whereas a first imprint lithography template holder may hold and move another imprint lithography template in the first region, to imprint into a layer of imprintable medium. By inspecting an imprint lithography template in a different region of the imprint lithography apparatus to the region in which imprinting takes place, a first imprint lithography template may be inspected while a second imprint lithography template is being imprinted into a layer of imprintable medium. This may increase throughput. The region or regions may be or comprise, for example, a chuck. An imprint lithography template holder might form or be such a chuck.

Inspection of an element constituting or, in use, being located within, the imprint lithography apparatus may be undertaken in any convenient manner. A single narrow beam of radiation may be directed toward the element, or part thereof, to be inspected. In another example, a wider beam (e.g. a flood exposure) may be used. The beam and/or the element may be static, or may be moved or scanned relative to one another. Inspection may involve detecting or measuring radiation that has been scattered, diffracted, refracted, reflected, absorbed, emitted or the like by the element.

As described above, a single radiation source provides both the actinic radiation and the inspection radiation, thus reducing the number of sources used in connection with the imprint lithography apparatus, or located within the imprint lithography apparatus. This results in space saving in terms of the overall size of the imprint lithography apparatus, or makes it easier to accommodate a separate source in connection with the imprint lithography apparatus, and may also result in cost savings due to the need to provide only a single source of radiation. The single source of radiation will need to be able to provide the required wavelength(s) of actinic radiation and wavelength(s) of inspection radiation. The source of radiation may therefore, for example, have a broad emission spectrum covering a number of wavelengths, or may have a number of peaks in its emission spectrum which coincide with, or substantially coincide with, the desired wavelengths for use as the actinic radiation and/or the inspection radiation. For example, a suitable source might be a mercury lamp, or a mercury/xenon lamp. However, as discussed previously, such a lamp has one or more disadvantages associated therewith, and in particular associated with their use of electrodes to generate the radiation.

According to a further aspect of the present invention, an imprint lithography apparatus is provided which overcomes one or more problems associated with existing or proposed imprint lithography apparatus which use a mercury or mercury/xenon lamp to generate actinic radiation (and/or inspection radiation). An imprint lithography apparatus according to an aspect of the present invention comprises an imprint lithography template holder to hold an imprint lithography template to imprint into a layer of imprintable medium. The imprint lithography apparatus further comprises, or is in connection with, an electrode-free radiation source to generate actinic radiation for use in fixing a pattern provided in a layer of imprintable medium by the imprint lithography template (possibly in combination with generating inspection radiation for use in inspecting an element of the imprint lithography apparatus). In an embodiment, the radiation source is a laser produced plasma radiation source.

Figure 7:
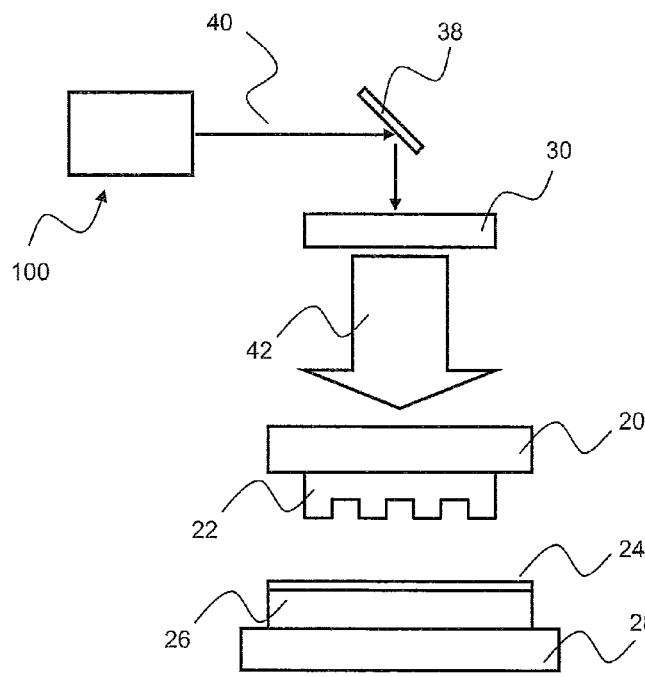
FIG. 7 schematically depicts an imprint lithography apparatus according to a different, but related, embodiment of the present invention.

FIG. 7 schematically depicts an imprint lithography apparatus in accordance with an embodiment of the present invention. The imprint lithography apparatus is, in this embodiment, substantially the same as that shown in relation to FIG. 2, but without the inspection system (an inspection system could of course be provided in this apparatus). Therefore, like features appearing in FIG. 2 have been given like reference numerals in FIG. 7 for clarity and consistency. In contrast with the apparatus shown in FIG. 2, the apparatus shown in FIG. 7 is provided with an electrode-free radiation source 100. The electrode-free radiation source is a laser produced plasma radiation source, such as that shown in U.S. Pat. No. 7,435,982 incorporated herein by reference in its entirety. The laser produced plasma radiation source 100 is free of electrodes and thus does not suffer from the degradation of electrodes (and the associated lifetime degradation) that is apparent in a mercury or mercury/xenon lamp discussed previously. Furthermore, a laser produced plasma radiation sources is known to generate high intensity of radiation over a broad spectrum, for example from UV (and deep or extreme UV) to infrared. Thus, such a radiation source may provide an adequate source of not only actinic radiation, but also inspection radiation, discussed in previous embodiments. UV radiation may be generated from such a source without the need for an expensive UV laser. Instead, an infrared laser may be used to generate UV radiation.

Figure 8:
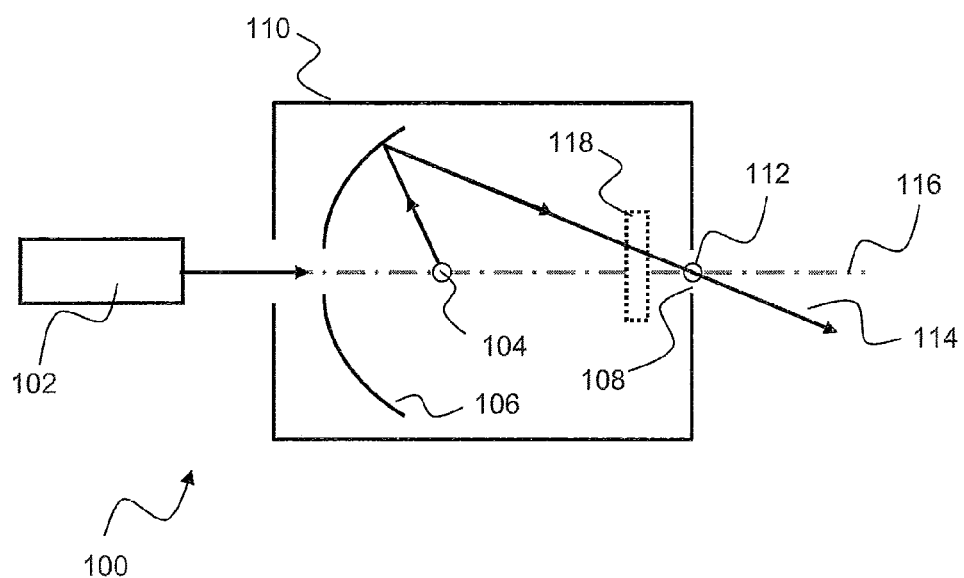
FIG. 8 schematically depicts a radiation source suitable for use in the imprint lithography apparatus of FIG. 7, or indeed the imprint lithography apparatus of any one or more of FIGS. 4 to 6.

FIG. 8 schematically depicts an example of a laser produced plasma radiation source 100. A laser 102 (e.g. an infrared laser) is arranged to deposit laser energy into a fuel, such as a droplet or region or vapor of xenon, tin, lithium, or the like, creating a highly ionized plasma 104 with electron temperatures of several 10's of eV. Energetic radiation generated during de-excitation and recombination of these ions is emitted from the plasma 104, and collected by a near normal incidence collector 106 and focused onto and through an opening 108 in an enclosing structure 110 (e.g. a source chamber or the like). An intermediate focus 112 of the radiation may be located adjacent to, or within the aperture 108, where the cross-section of the radiation (e.g. in beam form) will be smallest. This allows for a smaller aperture, reducing, for example, contamination flow into or out of the enclosure 110. The radiation 114 may propagate substantially along an optical axis 116 of the radiation source 100 and/or the imprint lithography apparatus.

When passing through the opening 108, the radiation 114 may be passed through one or more optional spectral purity filters, or contamination traps 118. In other embodiments, not shown, a spectral purity filter or contamination trap may be located in a different part of the radiation source, or external to the radiation source, for example in-between the radiation source and an imprint lithography apparatus, or in the imprint lithography apparatus itself.

An embodiment of the present invention relates to an imprint lithography apparatus and/or method. The imprint lithography apparatus and/or method may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc.

The pattern features described above may have one or more sub-micron (e.g. of the order of nanometers) dimensions.

In this specification, the term "substrate" is meant to include any surface layer forming part of the substrate, or being provided on another substrate, such as a planarization layer, adhesion layer or anti-reflection coating layer.

In use, an imprint lithography template may be held by an imprint lithography template holder. The imprint lithography template holder may hold the imprint lithography template using one of a number of different mechanisms, for example using electrostatic or magnetic forces, mechanical forces (e.g. via the use of piezoelectric elements or the like) or by vacuum forces. The imprint lithography template may be moved by appropriate movement of the imprint lithography template holder. In use, a substrate may be held by a substrate holder. The substrate holder may hold the substrate using one of a number of different mechanisms, for example using electrostatic or magnetic forces, mechanical forces (e.g. a clamp or the like) or by vacuum forces. The substrate may be moved by appropriate movement of the substrate holder.

In the above embodiments, a single imprint lithography template, a single imprint lithography template holder, a single substrate holder and a single substrate is described as being provided, and for example in a single chamber. In other embodiments, more than one imprint lithography template, more than one imprint lithography template holder, more than one substrate holder, and/or more than one substrate may be provided in one or more chambers, in order for imprints to be undertaken more efficiently or quickly (e.g. in parallel). For example, in an embodiment, there is provided an apparatus that includes a plurality (e.g. 2, 3, or 4) of substrate holders. In an embodiment, there is provided an apparatus that includes a plurality (e.g. 2, 3, or 4) of imprint lithography template holders and/or templates. In an embodiment, there is provided an apparatus configured to use one template holder and/or imprint lithography template per substrate holder. In an embodiment, there is provided an apparatus configured to use more than one template holder and/or imprint lithography template per substrate holder. In an embodiment, there is provided an apparatus that includes a plurality (e.g. 2, 3, or 4) of imprintable medium dispensers. In an embodiment, there is provided an apparatus configured to use one imprintable medium dispenser per substrate holder. In an embodiment, there is provided an apparatus configured to use one imprintable medium dispenser per imprint lithography template. In an embodiment, where an apparatus is provided that includes a plurality of substrate holders, the substrate holders may share functionalities in the apparatus. For instance, the substrate holders may share a substrate handler, a substrate cassette, a gas supply system (e.g. to create a helium environment during imprinting), an imprintable medium dispenser, and/or a radiation source (for curing the imprintable medium). In an embodiment, two or more of the substrate holders (e.g. 3 or 4) share one or more functionalities of the apparatus (e.g. 1, 2, 3, 4, or 5 functionalities). In an embodiment, one or more functionalities (e.g. 1, 2, 3, 4, or 5) of the apparatus are shared among all substrate holders.

The described and illustrated embodiments are to be considered as illustrative and not restrictive in character, it being understood that only the preferred embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

The invention claimed is:

1. An imprint lithography apparatus comprising:
an imprint lithography template holder configured to support an at least translucent imprint lithography template;
a substrate table configured to support a substrate having a layer of imprintable medium;
a single input radiation path configured to couple to a single source of actinic radiation and inspection radiation;
a pattern fixing system, configured to pass actinic radiation through the imprint lithography template to fix a pattern imprinted in the layer of imprintable medium by the imprint lithography template, the pattern fixing system having an output to directly provide the actinic radiation to the imprint lithography template;
an inspection system, configured to use inspection radiation to inspect a physical structural element of or on the imprint lithography template holder and/or the substrate table, the inspection system configured to provide the inspection radiation to be incident on the physical structural element and having a detector positioned to receive incident inspection radiation redirected by the physical structural element, the inspection system having an output to directly provide the inspection radiation to be incident on the physical structural element such that an optical axis of the inspection radiation when exiting the output of the inspection system is at a different angle than an optical axis of the actinic radiation when exiting the output of the pattern fixing system and/or such that the optical axis of the inspection radiation when exiting the output of the inspection system is at a horizontally offset position from the optical axis of the actinic radiation when exiting the output of the pattern fixing system; and
a switch or selector, wherein an optical path for the inspection radiation of the inspection system from the switch or selector to the output of the inspection system is different from an optical path for the actinic radiation of the pattern fixing system from the switch or selector to the output of the pattern fixing system and wherein (i) the switch is configured to alternately provide substantially all of the radiation it receives from the single input radiation path to respectively either the optical path of the inspection system or of the pattern fixing system or (ii) the selector is configured to provide actinic radiation from the single input radiation path of a first wavelength, but not radiation of a second different wavelength from the single input radiation path, to the optical path of the pattern fixing system and to provide the inspection radiation from the single input radiation path of the second wavelength to the optical path of the inspection system.

2. The imprint lithography apparatus of claim 1, further comprising a source of radiation, coupled to the single input radiation path, to provide both the actinic radiation and the inspection radiation.

3. The imprint lithography apparatus of claim 1, wherein there is at least a partial overlap in terms of wavelength between the actinic radiation and the inspection radiation.

4. The imprint lithography apparatus of claim 3, comprising the switch, the switch changeable between a first configuration and a second configuration, the switch in the first configuration allowing actinic radiation to pass to the pattern fixing system and preventing inspection radiation from passing to the inspection system, and/or the switch in the second configuration allowing inspection radiation to pass to the inspection system and preventing actinic radiation from passing to the pattern fixing system.

5. The imprint lithography apparatus of claim 4, wherein the switch comprises a moveable mirror.

6. The imprint lithography apparatus of claim 1, wherein there is either no overlap, or substantially no overlap, in terms of wavelength between the actinic radiation and the inspection radiation.

7. The imprint lithography apparatus of claim 6, comprising the selector, the selector configured to ensure that, from the single input radiation path, actinic radiation is allowed to pass to the pattern fixing system, and/or inspection radiation is allowed to pass to the inspection system.

8. The imprint lithography apparatus of claim 7, wherein the selector is one or more selected from the following: a grating, a beam splitter, a dichroic mirror, or a filter.

9. The imprint lithography apparatus of claim 1, wherein the physical structural element of or on the imprint lithography template holder and/or the substrate table is one or more selected from the following: the imprint lithography template, the pattern provided in the layer of imprintable medium by the imprint lithography template, or the layer of imprintable medium provided on the substrate.

10. The imprint lithography apparatus of claim 1, wherein the imprint lithography template holder is configured to hold and/or move the imprint lithography template in a first region of the imprint lithography apparatus to imprint into the layer of imprintable medium, and to move the imprint lithography template to, and/or hold the imprint lithography template in, a second region of the imprint lithography apparatus for inspection by the inspection system but without imprinting into the layer of imprintable medium with the imprint lithography template at the second region.

11. The imprint lithography apparatus of claim 1, comprising a further imprint lithography template holder to hold and/or move an imprint lithography template to imprint into a layer of imprintable medium.

12. The imprint lithography apparatus of claim 2, wherein the source of radiation comprises a laser produced plasma radiation source.

13. The imprint lithography apparatus of claim 1, wherein the imprint lithography template holder is configured to hold and/or move the imprint lithography template in a first region of the imprint lithography apparatus and comprising a further imprint lithography template holder to move a further imprint lithography template to, and/or hold the further imprint lithography template in, a second region of the imprint lithography apparatus for inspection by the inspection system but without imprinting into the layer of imprintable medium with the further imprint lithography template at the second region.

14. An imprint lithography apparatus comprising: an input radiation path configured to couple to a single source of actinic radiation and inspection radiation; a pattern fixing system, configured to pass actinic radiation through an imprint lithography template to fix a pattern provided in a layer of imprintable medium by the imprint lithography template, the pattern fixing system having an output to directly provide the actinic radiation to the imprint lithography template; an inspection system, configured to use inspection radiation to inspect a physical structural element of or on an imprint lithography template holder and/or a substrate table of the imprint lithography apparatus, the inspection system configured to provide the inspection radiation to be incident on the physical structural element and having a detector positioned to receive incident inspection radiation redirected by the physical structural element, the inspection system having an output to directly provide the inspection radiation to be incident on the physical structural element such that an optical axis of the inspection radiation when exiting the output of the inspection system is at a different angle than an optical axis of the actinic radiation when exiting the output of the pattern fixing system and/or such that the optical axis of the inspection radiation when exiting the output of the inspection system is at a horizontally offset position from the optical axis of the actinic radiation when exiting the output of the pattern fixing system; and a switch changeable between a first configuration and a second configuration, wherein an optical path for the inspection radiation of the inspection system from the switch to the output of the inspection system is different from an optical path for the actinic radiation of the pattern fixing system from the switch to the output of the pattern fixing system and wherein the switch in the first configuration allows actinic radiation from the input radiation path to pass to the optical path of the pattern fixing system and prevents substantially any radiation from the input radiation path from passing to the optical path of the inspection system, and the switch in the second configuration allows inspection radiation from the input radiation path to pass to the optical path of the inspection system and prevents substantially any radiation from the input radiation path from passing to the optical path of the pattern fixing system.

15. The imprint lithography apparatus of claim 14, wherein the switch comprises a moveable mirror.

16. The imprint lithography apparatus of claim 14, wherein the imprint lithography template holder is configured to hold and/or move the imprint lithography template in a first region of the imprint lithography apparatus to imprint into the layer of imprintable medium, and to move the imprint lithography template to, and/or hold the imprint lithography template in, a second region of the imprint lithography apparatus for inspection by the inspection system but without imprinting into the layer of imprintable medium with the imprint lithography template at the second region.

17. The imprint lithography apparatus of claim 14, wherein the imprint lithography template holder is configured to hold and/or move the lithography template in a first region of the imprint lithography apparatus to imprint into the layer of imprintable medium and comprising a further imprint lithography template holder to move a further imprint lithography template to, and/or hold the further imprint lithography template in, a second region of the imprint lithography apparatus for inspection by the inspection system but without imprinting into the layer of imprintable medium with the further imprint lithography template at the second region.

18. An imprint lithography apparatus comprising: an input radiation path configured to couple to a single source of actinic radiation and inspection radiation; a pattern fixing system, configured to pass actinic radiation through an imprint lithography template to fix a pattern provided in a layer of imprintable medium by the imprint lithography template, the pattern fixing system having an output to directly provide the actinic radiation to the imprint lithography template; an inspection system, configured to use inspection radiation to inspect a physical structural element of or on an imprint lithography template holder and/or a substrate table of the imprint lithography apparatus, the inspection system configured to provide the inspection radiation to be incident on the physical structural element and having a detector positioned to receive incident inspection radiation redirected by the physical structural element, the inspection system having an output to directly provide the inspection radiation to be incident on the physical structural element such that an optical axis of the inspection radiation when exiting the output of the inspection system is at a different angle than an optical axis of the actinic radiation when exiting the output of the pattern fixing system and/or such that the optical axis of the inspection radiation when exiting the output of the inspection system is at a horizontally offset position from the optical axis of the actinic radiation when exiting the output of the pattern fixing system; and a selector, wherein an optical path for the inspection radiation of the inspection system from the selector to the output of the inspection system is different from an optical path for the actinic radiation of the pattern fixing system from the selector to the output of the pattern fixing system and wherein the selector is configured to provide radiation from the input radiation path of a first wavelength, but not radiation of a second different wavelength, to the optical path of the pattern fixing system and to provide the radiation from the input radiation path of the second wavelength to the optical path of the inspection system.

19. The imprint lithography apparatus of claim 18, wherein the selector is one or more selected from the following: a grating, a beam splitter, a dichroic mirror, or a filter.

20. The imprint lithography apparatus of claim 18, wherein the imprint lithography template holder is configured to hold and/or move the imprint lithography template in a first region of the imprint lithography apparatus to imprint into the layer of imprintable medium, and to move the imprint lithography template to, and/or hold the imprint lithography template in, a second region of the imprint lithography apparatus for inspection by the inspection system but without imprinting into the layer of imprintable medium with the imprint lithography template at the second region.

* * * * *